United States Patent
Hazbun et al.

(10) Patent No.: US 12,362,172 B2
(45) Date of Patent: Jul. 15, 2025

(54) INTEGRATION OF COMPOUND-SEMICONDUCTOR-BASED DEVICES AND SILICON-BASED DEVICES

(71) Applicant: GlobalFoundries U.S. Inc., Malta, NY (US)

(72) Inventors: Ramsey Hazbun, Colchester, VT (US); Mark Levy, Williston, VT (US); Alvin Joseph, Williston, VT (US); Siva P. Adusumilli, South Burlington, VT (US)

(73) Assignee: GlobalFoundries U.S. Inc., Malta, NY (US)

( * ) Notice: Subject to any disclaimer, the term of this patent is extended or adjusted under 35 U.S.C. 154(b) by 668 days.

(21) Appl. No.: 17/571,932

(22) Filed: Jan. 10, 2022

(65) Prior Publication Data
US 2023/0223254 A1   Jul. 13, 2023

(51) Int. Cl.
*H01L 21/02* (2006.01)
*H01L 21/762* (2006.01)
(Continued)

(52) U.S. Cl.
CPC .... *H01L 21/0243* (2013.01); *H01L 21/02381* (2013.01); *H01L 21/76224* (2013.01);
(Continued)

(58) Field of Classification Search
CPC ........... H01L 21/0243; H01L 21/02381; H01L 21/76224; H01L 27/085; H01L 29/2003;
(Continued)

(56) References Cited

U.S. PATENT DOCUMENTS 8,665,013 B2   3/2014   Saunders
8,709,921 B2   4/2014   Su
(Continued)

FOREIGN PATENT DOCUMENTS

JP   2005094029 A   4/2005

OTHER PUBLICATIONS

Levy, Mark et al., "Device Integration Schemes Leveraging a Bulk Semiconductor Substrate Having a <111> Crystal Orientation" filed on Oct. 16, 2020 as a U.S. Appl. No. 17/072,649.
(Continued)

*Primary Examiner* — Yara B Green
*Assistant Examiner* — Akhee Sarker-Nag
(74) *Attorney, Agent, or Firm* — Thompson Hine LLP; Francois Pagette

(57) ABSTRACT

Structures including a compound-semiconductor-based device and a silicon-based device integrated on a semiconductor substrate and methods of forming such structures. The structure includes a first semiconductor layer having a top surface and a faceted surface that fully surrounds the top surface. The top surface has a first surface normal, and the faceted surface has a second surface normal that is inclined relative to the first surface normal. A layer stack that includes second semiconductor layers is positioned on the faceted surface of the first semiconductor layer. Each of the second semiconductor layers contains a compound semiconductor material. A silicon-based device is located on the top surface of the first semiconductor layer, and a compound-semiconductor-based device is located on the layer stack.

20 Claims, 4 Drawing Sheets

(51) Int. Cl.
*H10D 30/01* (2025.01)
*H10D 62/85* (2025.01)
*H10D 84/82* (2025.01)

(52) U.S. Cl.
CPC ....... *H10D 30/015* (2025.01); *H10D 62/8503* (2025.01); *H10D 84/82* (2025.01); *H01L 21/02433* (2013.01)

(58) Field of Classification Search
CPC ......... H01L 29/66462; H01L 21/02433; H01L 21/0254; H01L 21/02532; H01L 21/02587; H01L 21/02639; H01L 27/088; H01L 21/02609; H01L 21/02647; H01L 21/8258; H01L 29/0657; H01L 29/7786; H10D 30/015; H10D 62/8503; H10D 84/82; H10D 30/475; H10D 62/117; H10D 84/83; H10D 84/08
See application file for complete search history.

(56) References Cited

U.S. PATENT DOCUMENTS

| | | |
|---|---|---|
| 9,059,075 B2 | 6/2015 | Bayram et al. |
| 9,356,045 B2 | 5/2016 | Comeau et al. |
| 10,325,774 B2 | 6/2019 | Dasgupta et al. |
| 10,469,041 B2 | 11/2019 | Stamper et al. |
| 2014/0134830 A1* | 5/2014 | Bayram ............ H10D 62/8503 438/478 |
| 2015/0263090 A1* | 9/2015 | Inohara ................ H10D 62/126 257/192 |
| 2016/0064512 A1* | 3/2016 | Then ..................... H10D 30/62 438/172 |
| 2017/0236704 A1* | 8/2017 | Dasgupta ........... H10D 30/6211 257/76 |
| 2019/0238105 A1 | 8/2019 | Stamper et al. |

OTHER PUBLICATIONS

H. W. Then et al., "Gallium Nitride and Silicon Transistors on 300 mm Silicon Wafers Enabled by 3-D Monolithic Heterogeneous Integration," in IEEE Transactions on Electron Devices, vol. 67, No. 12, pp. 5306-5314, doi: 10.1109/TED.2020.3034076 (Dec. 2020).
European Patent Office, Extended European Search Report and Written Opinion issued in European Patent Application No. 22197904.0 on Jun. 5, 2023 (8 pages).

* cited by examiner

INTEGRATION OF COMPOUND-SEMICONDUCTOR-BASED DEVICES AND SILICON-BASED DEVICES

STATEMENT REGARDING FEDERALLY SPONSORED RESEARCH

This invention was made with government support under GaN PoC 130GaNRF1, Phase 1 awarded by Defense Microelectronics Agency. The government has certain rights in the invention.

BACKGROUND

The disclosure relates to semiconductor device fabrication and integrated circuits and, more specifically, to structures including a compound-semiconductor-based device and a silicon-based device integrated on a semiconductor substrate and methods of forming such structures.

High-voltage power electronic devices, such as high-electron-mobility transistors, may be fabricated using III-V compound semiconductors to exploit their material properties, such as a carrier mobility that is greater than the carrier mobility of silicon. A III-V compound semiconductor includes Group III elements (e.g., aluminum, gallium, indium) combined with Group V elements (e.g., nitrogen, phosphorus, arsenic, antimony). A high-electron-mobility transistor may include a heterojunction defined at an interface between crystalline III-V compound semiconductor materials having different band gaps. An example is a heterojunction between gallium nitride representing a binary III-V compound semiconductor material and aluminum-gallium nitride representing a trinary III-V compound semiconductor material. During operation, a two-dimensional electron gas is formed proximate to the heterojunction and defines the channel of the high-electron-mobility transistor.

The integration of high-electron-mobility transistors with other types of transistors, such as field-effect transistors or heterojunction bipolar transistors, on the same chip has proven to be complex. Integration may be achieved by wafer bonding or through the use of engineered or hybrid substrates. These techniques inherently introduce significant complexity to processes that integrate high-electron-mobility transistors with other types of transistors.

Improved structures including a compound-semiconductor-based device and a silicon-based device integrated on a semiconductor substrate and methods of forming such structures are needed.

SUMMARY

In an embodiment of the invention, a structure includes a first semiconductor layer having a top surface and a faceted surface that fully surrounds the top surface. The top surface has a first surface normal, and the faceted surface has a second surface normal that is inclined relative to the first surface normal. A layer stack is positioned on the faceted surface of the first semiconductor layer. The layer stack includes a plurality of second semiconductor layers, and each second semiconductor layer comprises a compound semiconductor material. A silicon-based device is located on the top surface of the first semiconductor layer, and a compound-semiconductor-based device is located on the layer stack.

In an embodiment of the invention, a method includes forming a first semiconductor layer having a top surface and a faceted surface that fully surrounds the top surface, and forming a layer stack positioned on the faceted surface of the first semiconductor layer. The top surface has a first surface normal, and the faceted surface has a second surface normal that is inclined relative to the first surface normal. The layer stack includes a plurality of second semiconductor layers, and each second semiconductor layer comprises a compound semiconductor material. The method further includes forming a silicon-based device on the top surface of the first semiconductor layer, and forming a compound-semiconductor-based device on the layer stack.

BRIEF DESCRIPTION OF THE DRAWINGS

The accompanying drawings, which are incorporated in and constitute a part of this specification, illustrate various embodiments of the invention and, together with a general description of the invention given above and the detailed description of the embodiments given below, serve to explain the embodiments of the invention. In the drawings, like reference numerals refer to like features in the various views.

DETAILED DESCRIPTION

Figure 1:
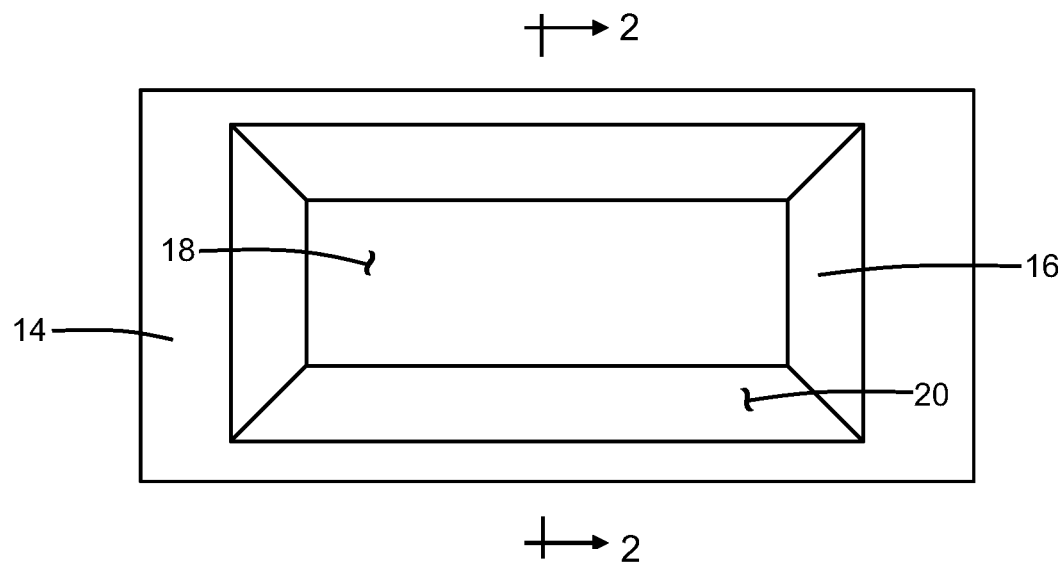
FIG. 1 is a top view of a structure at an initial fabrication stage in accordance with embodiments of the invention.
Figure 2:
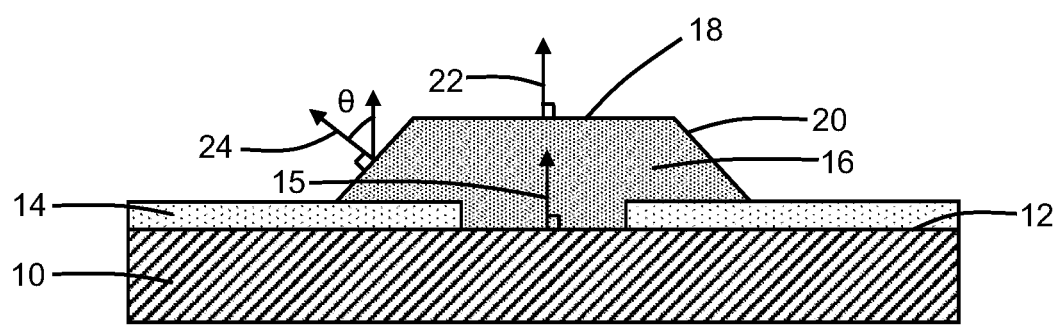
FIG. 2 is a cross-sectional view taken generally along line 2-2 in FIG. 1.

With reference to FIGS. 1, 2 and in accordance with embodiments of the invention, a semiconductor substrate 10 is provided that contains a single-crystal semiconductor material, such as single-crystal silicon. The semiconductor substrate 10 has a top surface 12, which may be planar. In an embodiment, the semiconductor substrate 10 may be a bulk substrate containing a single-crystal semiconductor material (e.g., single-crystal silicon). The semiconductor substrate 10 may have a surface normal 15 aligned perpendicular to the top surface 12. In an embodiment, the semiconductor substrate 10 may be a bulk substrate having a crystal lattice structure for which the surface normal 15 is aligned in a <100> direction. In an alternative embodiment, the semiconductor substrate 10 may be a bulk substrate having a crystal lattice structure for which the surface normal 15 is aligned in a <110> direction. In an alternative embodiment, the semiconductor substrate 10 may be a silicon-on-insulator substrate including a device layer with a crystal lattice structure characterized by the surface normal 15.

A dielectric layer 14 is formed on the top surface 12 of the semiconductor substrate 10 and patterned by lithography and etching processes to define an opening that exposes a surface area of given dimensions. The dielectric layer 14 may be comprised of a dielectric material, such as silicon dioxide, that is an electrical insulator, or comprised of a layer stack that includes multiple dielectric materials, such as a layer stack of silicon dioxide and silicon nitride.

A semiconductor layer 16 is formed that defines a raised structure (i.e., a three-dimensional mound or mesa) having a top surface 18 and a faceted surface 20 that fully surrounds the top surface 18. The semiconductor layer 16 may be comprised of a semiconductor material, such as silicon, that is formed by a selective epitaxial growth process from the surface area of the semiconductor substrate 10 that is exposed inside the window patterned in the dielectric layer 14. The semiconductor layer 16 grows upwardly from the exposed surface area of the semiconductor substrate 10 and out of the window in the dielectric layer 14, and then grows upwardly and laterally over the dielectric layer 14 about the opening in the dielectric layer 14. In an embodiment, the semiconductor layer 16 may be positioned fully above the top surface 12 of the semiconductor substrate 10.

The semiconductor layer 16 contains single-crystal semiconductor material characterized by multiple crystalline orientations arising from growth rates during the selective epitaxial growth process that are crystal-direction dependent. In that regard, the faceted surface 20 has an inclined orientation relative to the top surface 18 because of different crystal-direction-dependent growth rates. The top surface 18 has a surface normal 22 that is oriented and aligned perpendicular to the top surface 18, and the faceted surface 20 has a surface normal 24 that is oriented and aligned perpendicular to the faceted surface 20. In an embodiment, the surface normal 22 may be aligned to the surface normal 15 of the semiconductor substrate 10. The surface normal 24 is inclined at an angle θ relative to the surface normal 22 of the top surface 18. In an embodiment, the surface normal 24 of the faceted surface 20 may be aligned in a <111> direction of the crystal lattice structure of the semiconductor layer 16, and the surface normal 22 of the top surface 18 may be aligned in a <100> direction of the crystal lattice structure of the semiconductor layer 16. In an embodiment, the surface normal 24 of the faceted surface 20 may be aligned in a <111> direction of the crystal lattice structure of the semiconductor layer 16, and the surface normal 22 of the top surface 18 may be aligned in a <101> direction of the crystal lattice structure of the semiconductor layer 16.

Figure 3:
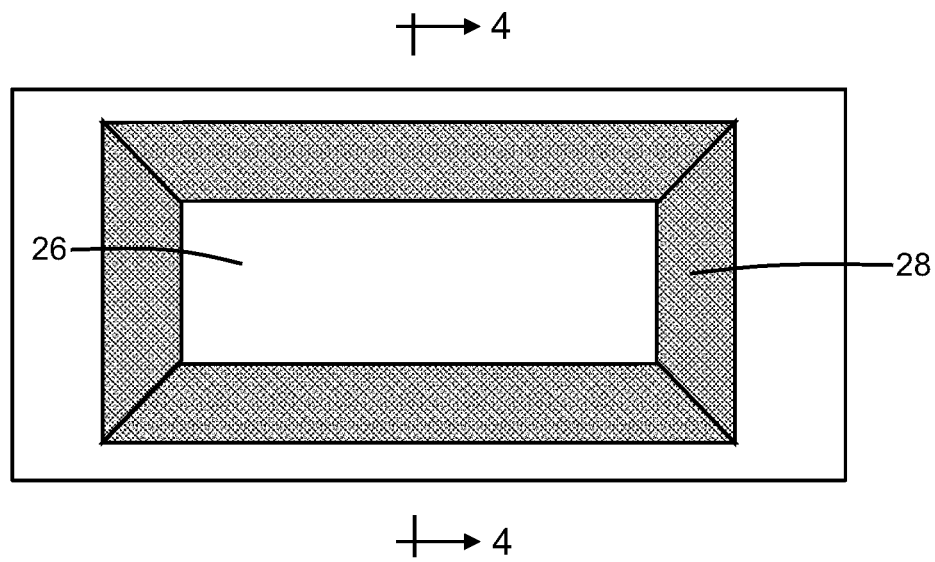
FIG. 3 is a top view of the structure at a fabrication stage subsequent to FIG. 1.
Figure 4:
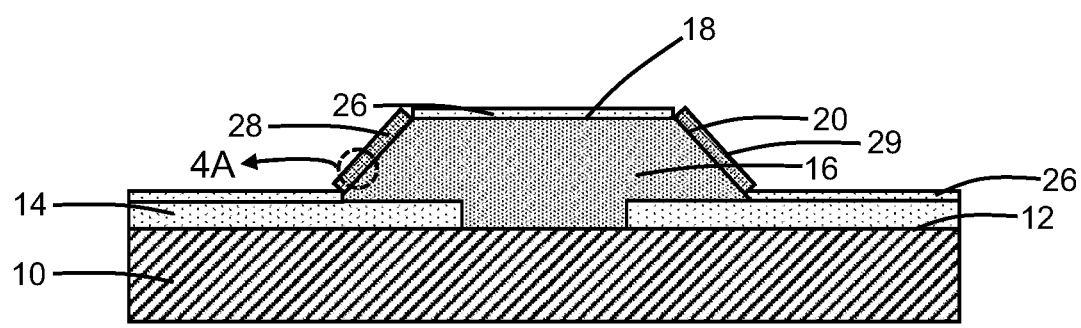
FIG. 4 is a cross-sectional view taken generally along line 4-4 in FIG. 3.
Figure 4A:
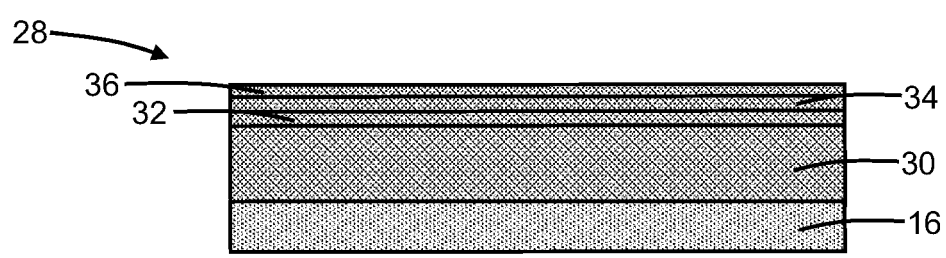
FIG. 4A is an enlarged view of a circled portion of FIG. 4.

With reference to FIGS. 3, 4, 4A in which like reference numerals refer to like features in FIGS. 1, 2 and at a subsequent fabrication stage, a dielectric layer 26 may be formed that covers the dielectric layer 14 and semiconductor layer 16. The dielectric layer 26 may be comprised of a dielectric material, such as silicon dioxide, that is an electrical insulator or comprised of a layer stack that includes multiple dielectric materials, such as a layer stack of silicon dioxide and silicon nitride. The dielectric layer 26 may be patterned by lithography and etching processes to define an opening that exposes the faceted surface 20. In an embodiment, the faceted surface 20 may be fully exposed by the patterning of the dielectric layer 26.

A layer stack 28 including compound semiconductor layers is formed on the faceted surface 20 of the semiconductor layer 16. In an embodiment, the layer stack 28 may include crystalline layers each comprised of a III-V compound semiconductor material. In an embodiment, at least one of the crystalline layers of the layer stack 28 may be comprised of a binary III-V compound semiconductor material. In an embodiment, at least one of the crystalline layers of the layer stack 28 may be comprised of a ternary III-V compound semiconductor material. In an embodiment, at least one of the crystalline layers of the layer stack 28 may be comprised of a binary III-V compound semiconductor material and at least one of the crystalline layers of the layer stack 28 may be comprised of a ternary III-V compound semiconductor material. In an embodiment, the crystalline layers of the layer stack 28 may be comprised of different III-V compound semiconductor materials. In an embodiment, the layer stack 28 may include crystalline layers that are comprised of gallium nitride or a ternary III-V compound semiconductor material based on gallium nitride (e.g., aluminum gallium nitride). In an embodiment, the layer stack 28 may include one or more crystalline layers that are comprised of gallium and nitrogen. In an alternative embodiment, the layer stack 28 may include at least one crystalline layer that is comprised of a II-VI compound semiconductor material. In an alternative embodiment, the layer stack 28 may include at least one crystalline layer that is comprised of silicon carbide, a silicide, or graphene.

The layer stack 28 may be formed by an epitaxial growth process, such as metalorganic chemical vapor deposition. In an embodiment, the layer stack 28 may be formed by a selective epitaxial growth process in which the semiconductor material does not nucleate and form on dielectric surfaces, such as the patterned dielectric layer 26. Each layer of the layer stack 28 may have a crystal structure that is single crystal or, alternatively, a crystal structure that is substantially single crystal with varying levels of crystalline defectivity present. The <111> crystal orientation of the semiconductor material (e.g., single-crystal silicon) of the faceted surface 20 of the semiconductor layer 16 promotes epitaxial growth of the III-V compound semiconductor material(s), such as gallium nitride, of the layer stack 28 with low crystalline defectivity through closer lattice matching than possible with surfaces having, for example, a <100> crystal orientation. In particular, the atoms on the surface plane of the semiconductor layer 16 with a <111> crystal orientation are arranged in hexagons, which may lattice match sufficiently well with the crystal structure of one or more of the compound semiconductor materials (e.g., the wurtzite crystal structure of gallium nitride that is based on a binary hexagonal close-packed crystal system) in the layer stack 28 to promote low-defect growth.

In an embodiment and as best shown in FIG. 4A, the layer stack 28 may include a buffer layer 30, a channel layer 32, a spacer layer 34, and a barrier layer 36 that are serially formed by the epitaxial growth process on the faceted surface 20. The layers 30, 32, 34, 36 may each have a crystal structure that is single crystal or, alternatively, a crystal structure that is substantially single crystal with varying levels of crystalline defectivity present. One or more of the layers 30, 32, 34, 36 may include multiple sub-layers characterized by varying composition or doping. The buffer layer 30 may contain a III-V compound semiconductor material, such as gallium nitride, that is tailored in terms of material composition, doping, and/or layer thickness to accommodate lattice mismatch with the semiconductor material of the semiconductor layer 16. The channel layer 32, which is disposed over the buffer layer 30, may contain a III-V compound semiconductor material, such as gallium nitride. The spacer layer 34 and the barrier layer 36 are disposed over the channel layer 32 with the spacer layer 34 between the channel layer 32 and the barrier layer 36. The spacer layer 34 may be thin and may contain a III-V compound semiconductor, such as aluminum nitride. The barrier layer 36 may contain a III-V compound semiconductor, such as aluminum gallium nitride, aluminum nitride, or indium aluminum nitride, that forms a heterojunction with the channel layer 32 of different composition. The heterojunction between the spacer layer 34 and barrier layer 36, along with the material properties of the channel layer 32, contribute to creating a two-dimensional electron gas, during device operation, that is filled with highly-mobile and abundant electrons.

Figure 5:
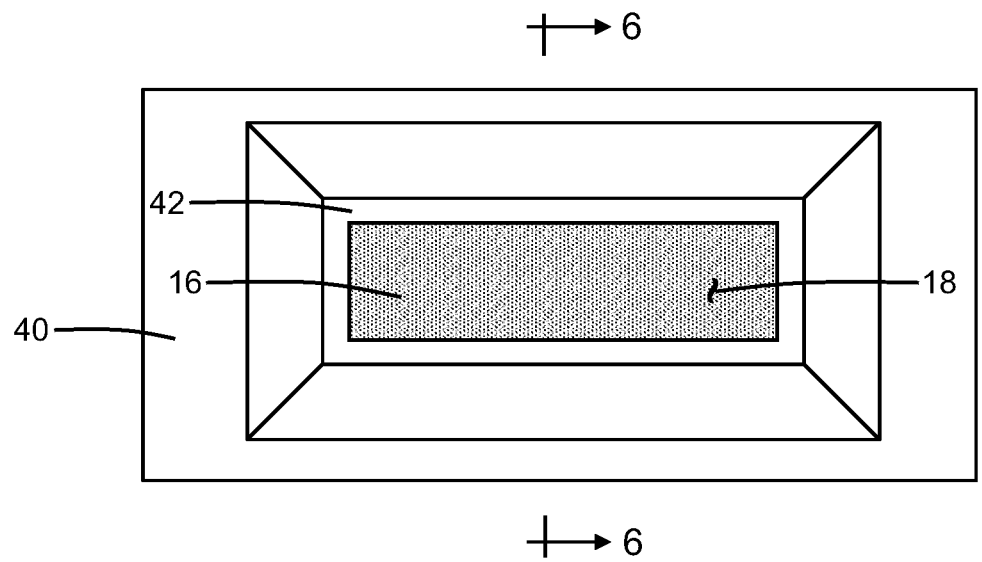
FIG. 5 is a top view of the structure at a fabrication stage subsequent to FIG. 3.
Figure 6:
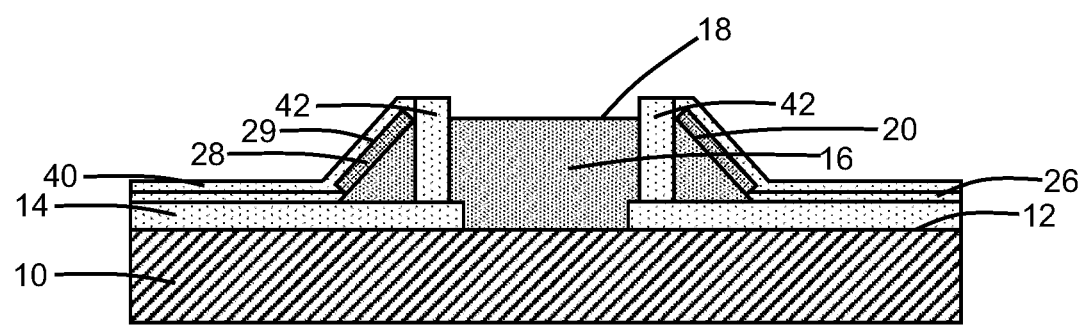
FIG. 6 is a cross-sectional view taken generally along line 6-6 in FIG. 5.

With reference to FIGS. 5, 6 in which like reference numerals refer to like features in FIGS. 3, 4 and at a subsequent fabrication stage, a dielectric layer 40 may be formed that covers the dielectric layer 26 and layer stack 28. The dielectric layer 40 may be comprised of a dielectric material, such as silicon dioxide, that is an electrical insulator. The dielectric layer 40 may be patterned by lithography and etching processes to define an opening that exposes the top surface 18 of the semiconductor layer 16. In an embodiment, the top surface 18 may be fully exposed by the patterning of the dielectric layer 40.

A trench isolation region 42 may be formed in the semiconductor layer 16 by patterning a trench surrounding the perimeter of the top surface 18 with lithography and etching processes, depositing a dielectric material to fill the trench, and planarizing and/or recessing the dielectric material. The trench isolation region 42 may contain a dielectric material, such as silicon dioxide, that is an electrical insulator. The trench isolation region 42 electrically isolates the portion of the semiconductor layer 16 beneath the top surface 18 from the surrounding portion of the semiconductor layer 16 beneath the faceted surface 20 and layer stack 28.

Figure 7:
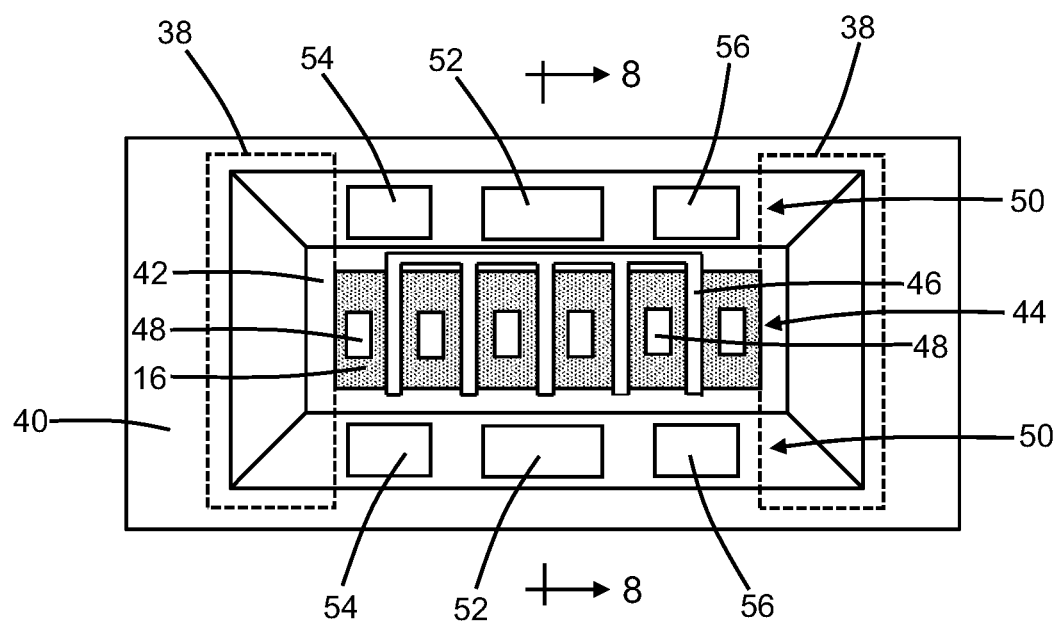
FIG. 7 is a top view of the structure at a fabrication stage subsequent to FIG. 5.
Figure 8:
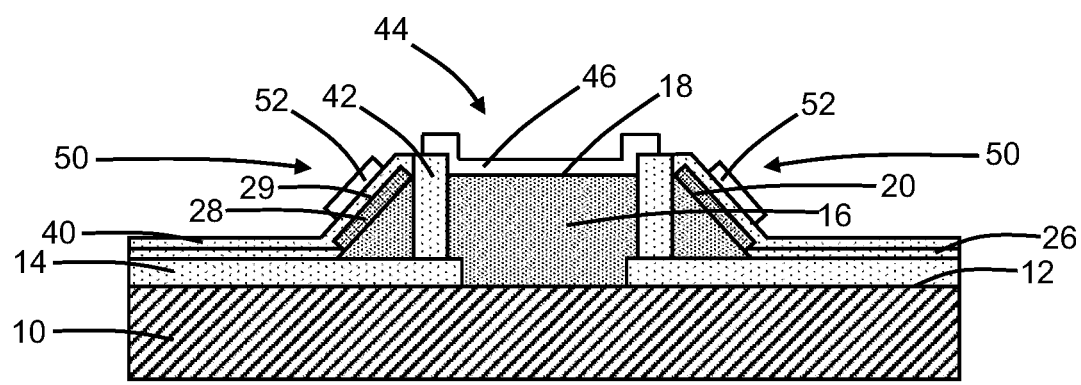
FIG. 8 is a cross-sectional view taken generally along line 8-8 in FIG. 7.

With reference to FIGS. 7, 8 in which like reference numerals refer to like features in FIGS. 5, 6 and at a subsequent fabrication stage, isolation regions 38 may be formed in the layer stack 28. In an embodiment, the isolation regions 38 may be formed at the opposite ends of the layer stack 28. The isolation regions 38 may be formed by, for example, a masked implantation of a suitable species, such as either nitrogen or argon. The isolation regions 38 may be used to terminate and localize the two-dimensional electron gas formed during device operation. The isolation regions 38 effectively partition the layer stack 28 into a pair of distinct active device regions, which may be symmetrically positioned on the semiconductor layer 16, at opposite side edges of the top surface 18 of the semiconductor layer 16.

In an alternative embodiment, the electrical isolation of the active device regions of the layer stack 28 may be provided by patterning the dielectric layer 26 such that the opposite ends of the faceted surface 20 remain covered by the dielectric layer 26 before the layer stack 28 is epitaxially grown by a selective epitaxial growth process on the exposed portions of the faceted surface 20. The absence of the layer stack 28 at the opposite ends of the faceted surface 20 partitions the layer stack 28 into the pair of electrically-isolated active device regions.

A silicon-based device may be formed by front-end-of-line processing on the top surface 18 of the semiconductor layer 16. As used herein, a device that is positioned on, or formed on, a surface may include features that are located beneath the surface. In an embodiment, the silicon-based device may be a field-effect transistor 44 that includes a gate 46 and source/drain regions 48. The gate 46 may include gate fingers formed by patterning a deposited layer of heavily-doped polysilicon, and the source/drain regions 48 may be formed by masked ion implantation or diffusion of, for example, an n-type dopant into the semiconductor layer 16 and may include raised epitaxial portions. In alternative embodiments, the silicon-based device may be a bipolar junction transistor, a heterojunction bipolar transistor, a passive device (e.g., capacitor, resistor, or diode), or combinations thereof or with the field-effect transistor 44.

A pair of compound-semiconductor-based devices, such as high-electron-mobility transistors 50, may be formed on the surface 29 of the layer stack 28. Each high-electron-mobility transistor 50 may be formed in one of the active device regions of the layer stack 28. The high-electron-mobility transistors 50 in the different active device regions of the layer stack 28 are electrically isolated from each other by the isolation regions 38. Each high-electron-mobility transistor 50 may include a gate 52 comprised of a layer of a doped III-V compound semiconductor, such as p-type gallium nitride or p-type aluminum-gallium-nitride doped with magnesium, and an overlying layer of one or more metals, such as aluminum-copper, titanium nitride, titanium, etc. Each high-electron-mobility transistor 50 may also include a source 54 and a drain 56 that are formed on different portions of the layer stack 28. In an embodiment, the source 54 and drain 56 may comprise an ohmic metal, such as titanium, titanium nitride, aluminum, silicon, or a combination of these materials.

Middle-of-line processing and back-end-of-line processing follow, which includes formation of contacts, vias, and wiring for an interconnect structure that is coupled to the field-effect transistor 44 and the high-electron-mobility transistors 50.

The silicon-based device (e.g., field-effect transistor 44) and the compound-semiconductor-based devices (e.g., high-electron-mobility transistors 50) are formed on the same semiconductor layer 16. In particular, the silicon-based device and the compound-semiconductor-based devices are formed in proximity on a faceted mesa defined by the semiconductor layer 16. The formation of the layer stack 28 on the faceted surface 20 of the semiconductor layer 16, which has a <111> crystal orientation, permits the integration of the silicon-based device and the compound-semiconductor-based devices absent a complex integration scheme, such as wafer bonding. Monolithic integration of the silicon-based device and the compound-semiconductor-based devices on the same semiconductor substrate 10 may provide both a low-cost construction and high-performance devices with improved operational parameters.

The methods as described above are used in the fabrication of integrated circuit chips. The resulting integrated circuit chips can be distributed by the fabricator in raw wafer form (e.g., as a single wafer that has multiple unpackaged chips), as a bare die, or in a packaged form. In the latter case, the chip is mounted in a single chip package (e.g., a plastic carrier, with leads that are affixed to a motherboard or other higher level carrier) or in a multichip package (e.g., a ceramic carrier that has either or both surface interconnections or buried interconnections). In any case, the chip may be integrated with other chips, discrete circuit elements, and/or other signal processing devices as part of either an intermediate product or an end product.

References herein to terms modified by language of approximation, such as "about", "approximately", and "substantially", are not to be limited to the precise value specified. The language of approximation may correspond to the precision of an instrument used to measure the value and, unless otherwise dependent on the precision of the instrument, may indicate a range of +/−10% of the stated value(s).

References herein to terms such as "vertical", "horizontal", etc. are made by way of example, and not by way of limitation, to establish a frame of reference. The term "horizontal" as used herein is defined as a plane parallel to a conventional plane of a semiconductor substrate, regardless of its actual three-dimensional spatial orientation. The terms "vertical" and "normal" refer to a direction perpendicular to the horizontal, as just defined. The term "lateral" refers to a direction within the horizontal plane.

A feature "connected" or "coupled" to or with another feature may be directly connected or coupled to or with the other feature or, instead, one or more intervening features may be present. A feature may be "directly connected" or "directly coupled" to or with another feature if intervening features are absent. A feature may be "indirectly connected" or "indirectly coupled" to or with another feature if at least one intervening feature is present. A feature "on" or "contacting" another feature may be directly on or in direct contact with the other feature or, instead, one or more intervening features may be present. A feature may be "directly on" or in "direct contact" with another feature if intervening features are absent. A feature may be "indirectly on" or in "indirect contact" with another feature if at least one intervening feature is present.

The descriptions of the various embodiments of the present invention have been presented for purposes of illustration but are not intended to be exhaustive or limited to the embodiments disclosed. Many modifications and variations will be apparent to those of ordinary skill in the art without departing from the scope and spirit of the described embodiments. The terminology used herein was chosen to best explain the principles of the embodiments, the practical application or technical improvement over technologies found in the marketplace, or to enable others of ordinary skill in the art to understand the embodiments disclosed herein.

What is claimed is:

1. A structure comprising:
   a semiconductor substrate having a top surface, the semiconductor substrate comprising single-crystal silicon;
   a dielectric layer on the semiconductor substrate, the dielectric layer including an opening penetrating through the dielectric layer to the semiconductor substrate;
   a first semiconductor layer having a top surface and a faceted surface that fully surrounds the top surface, the first semiconductor layer comprising single-crystal silicon, the first semiconductor layer positioned above the top surface of the semiconductor substrate, the first semiconductor layer extending through the opening in the dielectric layer to the semiconductor substrate and laterally from the opening in the dielectric layer over the dielectric layer, the top surface of the first semiconductor layer having a first surface normal, and the faceted surface having a second surface normal that is inclined relative to the first surface normal;
   a layer stack positioned on the faceted surface of the first semiconductor layer, the layer stack including a plurality of second semiconductor layers, and each second semiconductor layer comprised of a compound semiconductor material;
   a silicon-based device on the top surface of the first semiconductor layer; and
   a first compound-semiconductor-based device on the layer stack.

2. The structure of claim 1 wherein the layer stack is fully positioned on the faceted surface of the first semiconductor layer and surrounds the top surface of the first semiconductor layer.

3. The structure of claim 1 wherein the faceted surface has a surface normal aligned in a <111> direction of a crystal lattice structure of the first semiconductor layer.

4. The structure of claim 3 wherein the top surface of the first semiconductor layer has a surface normal aligned in a <100> direction of the crystal lattice structure of the first semiconductor layer.

5. The structure of claim 3 wherein the top surface of the first semiconductor layer has a surface normal aligned in a <101> direction of the crystal lattice structure of the first semiconductor layer.

6. The structure of claim 1 wherein the top surface of the first semiconductor layer has a surface normal aligned in a <100> direction of a crystal lattice structure of the first semiconductor layer, the top surface of the semiconductor substrate has a surface normal aligned in a <100> direction of a crystal lattice structure of the semiconductor substrate, and the faceted surface has a surface normal aligned in a <111> direction of the crystal lattice structure of the first semiconductor layer.

7. The structure of claim 1 wherein the top surface of the first semiconductor layer has a surface normal aligned in a <101> direction of a crystal lattice structure of the first semiconductor layer, the top surface of the semiconductor substrate has a surface normal aligned in a <101> direction of a crystal lattice structure of the semiconductor substrate, and the faceted surface has a surface normal aligned in a <111> direction of the crystal lattice structure of the first semiconductor layer.

8. The structure of claim 1 further comprising:
   a trench isolation region in the first semiconductor layer, the trench isolation region surrounding the top surface of the first semiconductor layer, and the trench isolation region comprising a dielectric material.

9. The structure of claim 8 wherein the trench isolation region is laterally positioned between the top surface of the first semiconductor layer and the faceted surface of the first semiconductor layer.

10. The structure of claim 1 wherein the silicon-based device is a field-effect transistor, and the first compound-semiconductor-based device is a high-electron-mobility transistor.

11. The structure of claim 1 further comprising:
    a second compound-semiconductor-based device on the layer stack,
    wherein the top surface of the first semiconductor layer is laterally positioned between the first compound-semiconductor-based device and the second compound-semiconductor-based device.

12. The structure of claim 11 further comprising:
    a first isolation region in the layer stack; and
    a second isolation region in the layer stack,
    wherein the first isolation region and the second isolation region are positioned in the layer stack between the first compound-semiconductor-based device and the second compound-semiconductor-based device.

13. The structure of claim 12 wherein the layer stack includes discontinuities on the faceted surface of the first semiconductor layer providing electric isolation between the first compound-semiconductor-based device and the second compound-semiconductor-based device.

14. The structure of claim 1 wherein the first semiconductor layer comprises single-crystal silicon, and the compound semiconductor material of at least one of the plurality of second semiconductor layers comprises a III-V compound semiconductor material.

15. The structure of claim 1 wherein the first semiconductor layer comprises single-crystal silicon, and the compound semiconductor material of at least one of the plurality of second semiconductor layers comprises a II-VI compound semiconductor material.

16. A method comprising:

forming a dielectric layer on a semiconductor substrate, wherein the semiconductor substrate has a top surface, the semiconductor substrate comprises single-crystal silicon, and the dielectric layer includes an opening penetrating through the dielectric layer to the semiconductor substrate;

forming a first semiconductor layer having a top surface and a faceted surface that fully surrounds the top surface, wherein the first semiconductor layer comprises single-crystal silicon, the first semiconductor layer is positioned above the top surface of the semiconductor substrate, the first semiconductor layer extends through the opening in the dielectric layer to the semiconductor substrate and laterally from the opening in the dielectric layer over the dielectric layer, the top surface of the first semiconductor layer has a first surface normal, and the faceted surface has a second surface normal that is inclined relative to the first surface normal;

forming a layer stack positioned on the faceted surface of the first semiconductor layer, wherein the layer stack includes a plurality of second semiconductor layers, and each second semiconductor layer comprises a compound semiconductor material;

forming a silicon-based device on the top surface of the first semiconductor layer; and forming a compound-semiconductor-based device on the layer stack.

17. The method of claim 16 wherein the layer stack is fully positioned on the faceted surface of the first semiconductor layer and surrounds the top surface of the first semiconductor layer.

18. The method of claim 16 further comprising:

forming a trench isolation region in the first semiconductor layer, wherein the trench isolation region surrounds the top surface of the first semiconductor layer, the trench isolation region comprises a dielectric material, and the trench isolation region is laterally positioned between the top surface of the first semiconductor layer and the faceted surface of the first semiconductor layer.

19. The method of claim 16 wherein the faceted surface has a surface normal aligned in a <111> direction of a crystal lattice structure of the first semiconductor layer, and the top surface of the first semiconductor layer has a surface normal aligned in a <100> direction of the crystal lattice structure of the first semiconductor layer.

20. The method of claim 16 wherein the faceted surface has a surface normal aligned in a <111> direction of a crystal lattice structure of the first semiconductor layer, and the top surface of the first semiconductor layer has a surface normal aligned in a <101> direction of the crystal lattice structure of the first semiconductor layer.

* * * * *